United States Patent [19]

Yamaha et al.

[11] Patent Number: 5,705,429
[45] Date of Patent: Jan. 6, 1998

[54] METHOD OF MANUFACTURING ALUMINUM WIRING AT A SUBSTRATE TEMPERATURE FROM 100 TO 150 DEGREES CELSIUS

[75] Inventors: Takahisa Yamaha; Satoshi Hibino; Masaru Naito, all of Hamamatsu, Japan

[73] Assignee: Yamaha Corporation, Japan

[21] Appl. No.: 467,846

[22] Filed: Jun. 6, 1995

Related U.S. Application Data

[63] Continuation-in-part of Ser. No. 317,031, Oct. 3, 1994, abandoned.

[30] Foreign Application Priority Data

Oct. 4, 1993 [JP] Japan ..................... 5-271335

[51] Int. Cl.$^6$ ..................................... H01L 21/28
[52] U.S. Cl. ................ 437/194; 437/192; 437/198; 437/981
[58] Field of Search ........................ 437/192, 194, 437/195, 947, 981

[56] References Cited

U.S. PATENT DOCUMENTS

| | | | |
|---|---|---|---|
| 4,970,176 | 11/1990 | Tracy et al. | 437/247 |
| 5,155,063 | 10/1992 | Ito | 437/190 |
| 5,232,871 | 8/1993 | Ho | 437/190 |
| 5,266,521 | 11/1993 | Lee et al. | 437/188 |
| 5,290,731 | 3/1994 | Suagno et al. | 437/174 |
| 5,342,808 | 8/1994 | Brigham et al. | 437/228 |
| 5,371,042 | 12/1994 | Ong | 437/194 |

FOREIGN PATENT DOCUMENTS

02271632  1/1991  Japan.

OTHER PUBLICATIONS

Praminik et al, "Effect of Underlayer on Sputtered Aluminum Grain Structure and its Correlation with Step Coverage in Submicron Vias", VMIC Conference, Jun. 12–13, 1990, pp. 332–334.
S. Wolf, "Silicon Processing for the VLSI Era, vol. 1", Lattice Press, 1986, pp. 365–371.

*Primary Examiner*—John Niebling
*Assistant Examiner*—Thomas G. Bilodeau
*Attorney, Agent, or Firm*—Ostrolenk, Faber, Gerb & Soffen, LLP

[57] ABSTRACT

After forming a contact hole in an insulator layer, which is formed on a substrate covering an impurity doped region, a Ti film, a TiN film (or TiON film), and an Al alloy (for example, an alloy of Al—Si—Cu) layer are sputtered (consecutively from the bottom level) for forming a wiring material layer. A wiring layer is formed by patterning the wiring material layer in accordance with a wiring pattern. Portions with a 0% coverage of the Al alloy layer are eliminated by sputtering the Al alloy layer with a substrate temperature in a range between 100° and 150° C.

26 Claims, 7 Drawing Sheets

METHOD OF MANUFACTURING ALUMINUM WIRING AT A SUBSTRATE TEMPERATURE FROM 100 TO 150 DEGREES CELSIUS

CROSS REFERENCE TO RELATED APPLICATION

This is a continuation-in-part application of a U.S. patent application, Ser. No. 08/317,031, filed on Oct. 3, 1994, now abandoned.

BACKGROUND OF THE INVENTION a) Field of the Invention

The present invention relates to a method of manufacturing wiring, and more particularly to a method of manufacturing aluminum wiring of a semiconductor device by forming an Al alloy layer connected via a contact hole with an underlying layer by sputtering.

b) Definition of Coverage

Here, coverage is defined as follows. As shown in FIG. 10, a contact hole 13 is formed through an insulator layer 14 that covers a substrate 10. A barrier metal layer 15 (for example, a laminate of TiN film on Ti film) is formed on the insulator layer 14, and on which barrier metal layer an Al alloy metal layer 20 is formed. A maximum thickness of Al alloy layer 20 which is the main wiring layer is denoted by $t_{max}$ and a minimum thickness of Al alloy layer 20 is denoted by $t_{min}$. Coverage is expressed by a formula $[t_{min}/t_{max}] \times 100\%$.

c) Description of the Related Art

As a manufacturing method of wiring in a semiconductor device having a connection with an underlying layer via a contact hole formed vertically in an insulating film, a method is known of forming a laminate of a barrier metal layer and an aluminum alloy layer. A wiring material layer comprising, consecutively from the lower level, Ti film, TiN film and Al alloy layer is deposited and patterned to form wiring.

According to this technique, formation of Al alloy layer by sputtering may yield a low coverage of Al alloy, and may yield a coverage of 0%. Coverage of 0% means a breakage of an Al alloy layer at the thinnest portion thereof.

SUMMARY OF THE INVENTION

An object of the present invention is to provide a method of manufacturing aluminum wiring that can suppress reduction of an coverage of Al alloy layer at a contact portion.

According to one aspect of the present invention, there is provided a method of manufacturing wiring comprising the steps of forming on a substrate having a contact portion, an insulator layer, provided with a contact hole having a horizontal portion, a slope portion, and a vertical portion in alignment to the contact portion, sputtering a wiring layer comprising Ti film, TiN or TiON film, and Al alloy layer consecutively from the lower level, to cover said contact hole and said insulator layer wherein said Al alloy layer is sputtered with a substrate temperature range set between 100° to 150° C., and patterning the wiring material layer to form a wiring layer according to a wiring pattern.

It was found by the inventors of the present invention that coverage of Al alloy at a contact portion via a contact hole comprising a horizontal portion, a slope portion, and a vertical portion, depends on a substrate temperature at the time of sputtering Al alloy. Namely, with a substrate temperature lower than 50° C., surface of an Al alloy layer becomes uneven yielding portions having hardly any Al alloy. With a temperature more than 200° C., portions having no Al alloy is yielded (in other word, breakage of an Al alloy layer occurs). To the contrary, when the substrate temperature is set to a range of 100° to 150° C., an Al alloy layer is deposited on a whole surface of a barrier metal without yielding unevenness so that portions with a 0% coverage is are eliminated.

Thus, portions of 0% coverage of Al alloy are removed from a contact portion comprising a horizontal portion, a slope portion, and a vertical portion. Therefore, yield in forming wiring is enhanced, and reliability of wiring is improved.

DESCRIPTION OF THE PREFERRED EMBODIMENTS

"Aluminum wiring", in this specification, means wiring that comprises a main conductive path formed of aluminum or aluminum alloy. For example, it is wiring formed of a laminate of a barrier metal layer and an aluminum alloy layer.

Figure 1:
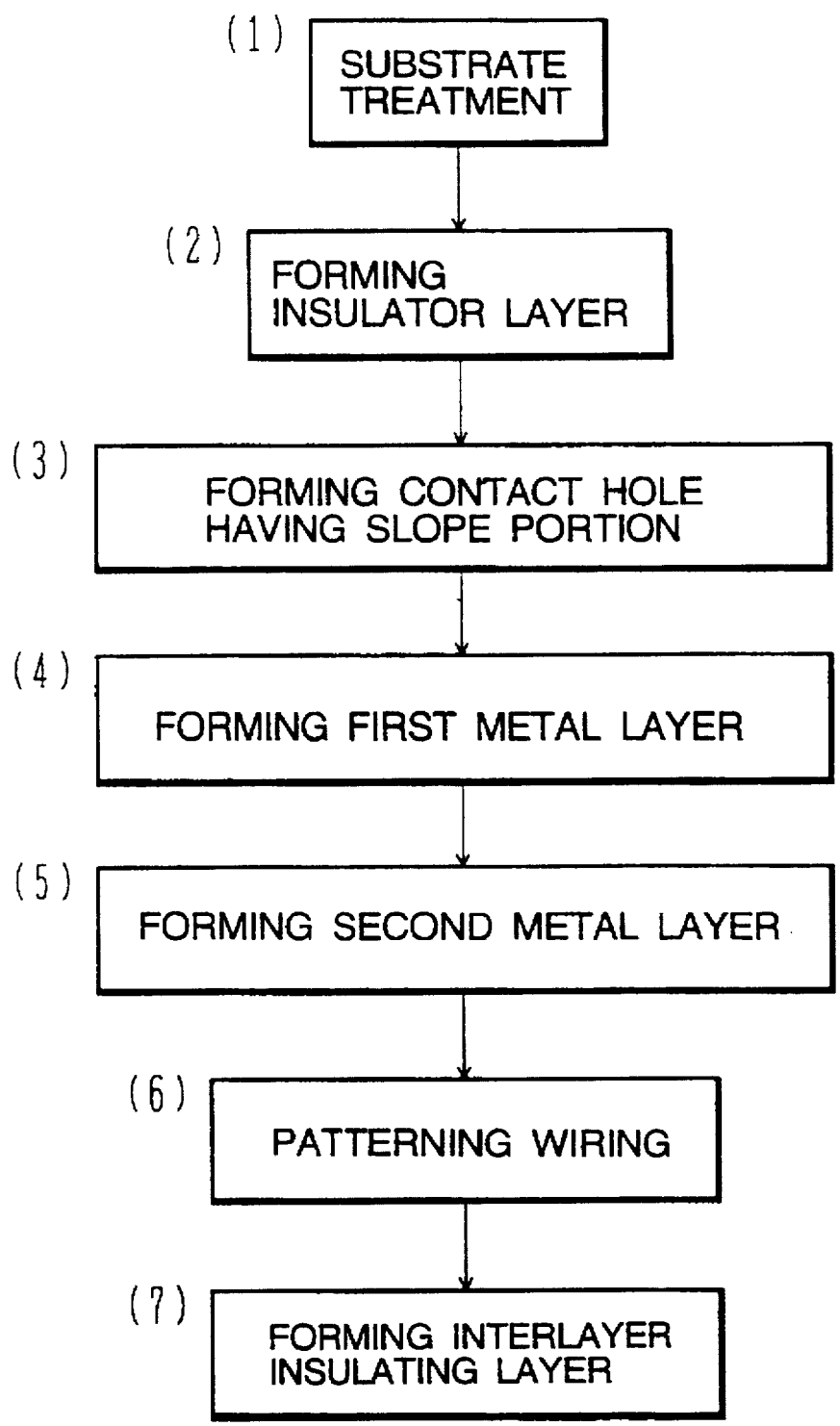
FIG. 1 is a flow chart of a method of forming wiring according to an embodiment of the present invention.

FIG. 1 is a flow chart of wiring forming steps according to an embodiment of the present invention. Manufacture of a MOS transistor will be described hereunder following the flow chart.

1. Substrate treatment step:

On a surface of a substrate comprised of Si, a thermal oxide film is formed. A resist film is formed on the oxide film. By exposing and developing the resist film, a resist mask is formed. Etching of the oxide film is performed using the resist mask. Using the resist mask and the oxide film as an ion implantation mask, deep ion implantation of an n-type or p-type impurity is performed. A p-type well layer or an n-type well layer is to be formed by an annealing process performed afterwards. The resist mask is removed before annealing. The oxide film is removed by etching after the well is formed. In the case of a CMOS circuit, annealing is performed after separate ion implantations of n-type ion and p-type ion using respective masks.

Then again, a thin oxide film is formed by thermal oxidation. And, further, an $SiN_x$ film is formed thereon using chemical vapor deposition (CVD). A resist film is formed on $SiN_x$. $SiN_x$ film is etched with a resist mask obtained by exposing and developing the resist film. After removing the resist film, thermal oxidation is performed with a mask of $SiN_x$, to form a field oxide film.

Further, a polycrystalline Si layer and a WSi layer are formed on a whole surface of the substrate by sputtering. Then a resist film is formed thereon and a resist mask is formed by exposure and development. Using the resist mask as an etching mask, the polycrystalline Si layer, and the WSi layer are etched to form a gate electrode. The resist is removed after etching.

A resist film is formed on the whole surface of the substrate. A resist mask is formed by exposure (e.g. in a stepper using the g or the i line of mercury) and development. Using the resist mask, the gate electrode, and the field oxide film as an ion implantation mask, a high density impurity ion of n-type or p-type is implanted. The resist film is removed thereafter. Source/drain regions of an n-channel or a p-channel transistor are formed by annealing.

Here, before the step of forming source/drain regions, lightly doped drain (LDD) regions may be formed by a predetermined conductivity type ion implantation, and then side wall spacers may be formed.

Figure 2:
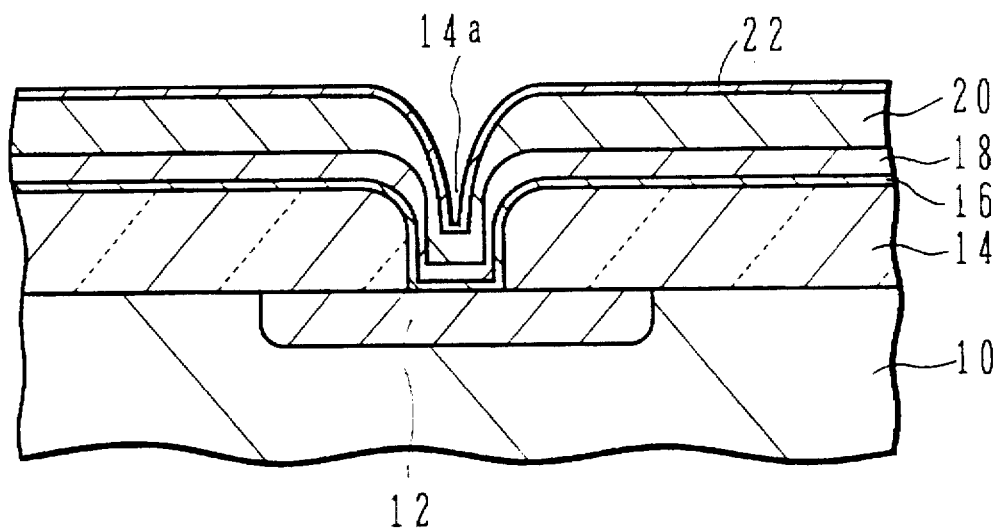
FIG. 2 is a sectional view of a substrate showing a step of covering wiring material in a method of forming wiring according to the embodiment.
Figure 3:
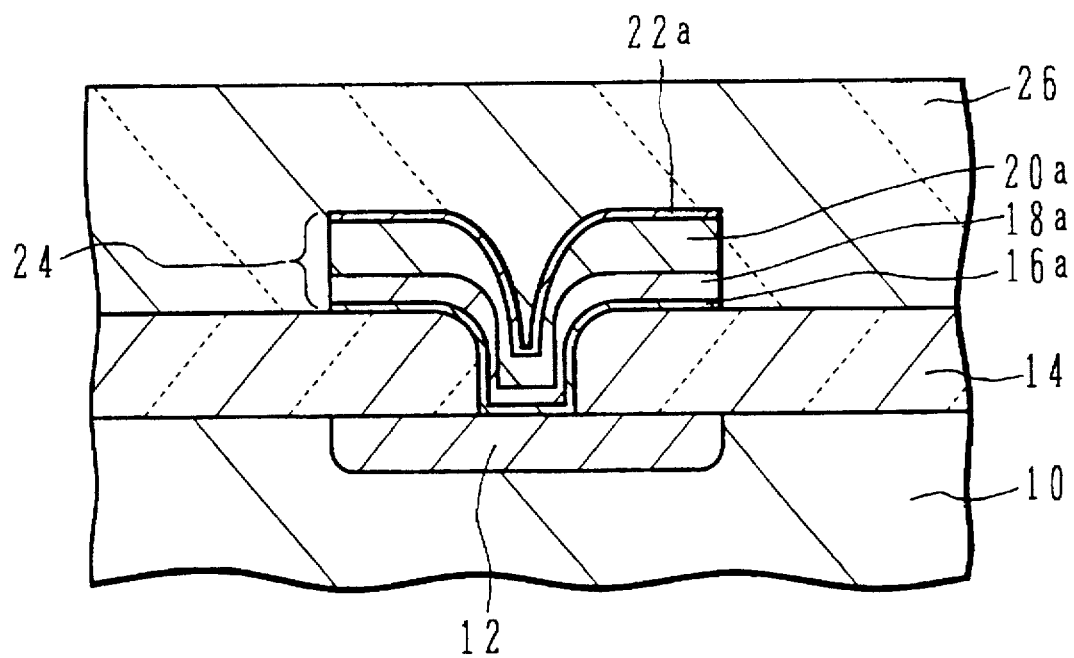
FIG. 3 is a sectional view of the substrate showing a step of patterning wiring following the step as shown in FIG. 2.

2. Insulating layer forming step:

FIGS. 2 and 3 show sectional views of a wiring portion of MOS transistor element in successive steps of manufacturing. The wiring is formed for connection with source/drain electrode of MOS transistor. Following steps will be described referring to the figures.

An impurity doped region 12 that is a source/drain region has been provided on a surface region of a semiconductor substrate 10 provided with a p-type well or an n-type well. An insulator layer 14 is formed covering the doped region 12 with a thickness of approximately 700 nm. The insulator layer 14 is formed of CVD (chemical vapor deposition) oxide using boron phosphosilicate glass (BPSG), phosphosilicate glass (PSG), or tetraethoxysilane (TEOS) oxide. Spin-on-glass (SOG) may also be employed as an insulator layer.

3. Contact hole forming process:

Next, a resist film is formed on the insulator layer 14. By exposing and developing the resist film, a resist mask is formed. A contact hole 14a having a sloped portion and a vertical portion is formed by etching using the resist mask.

Here, for forming a slope shape in the contact hole, either of the following methods is employed: a method that performs isotropic etching by wet etching firstly, and then anisotropic etching; or another method that performs anisotropic etching, firstly, for forming a vertical contact hole, and then, an edge portion is rounded off by flowing the insulator layer with a heat treatment.

Such a contact hole having a lower vertical wall and an upper diverging (toward upside) wall is very advantageous for forming a precise contact area with an underlying layer and for establishing a conductive path to a desired location with a low resistance and good step coverage.

Figure 4A:
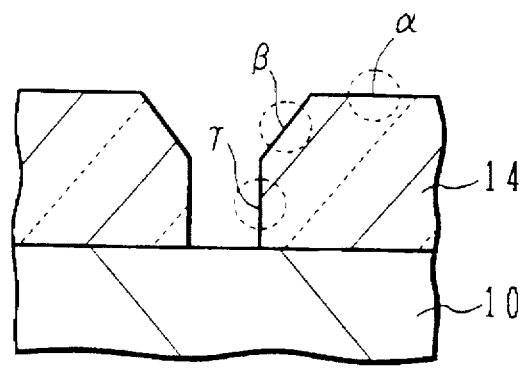
FIGS. 4A to 4C are sectional views of the substrate showing shapes of the contact hole comprising a slope portion.
Figure 4B:
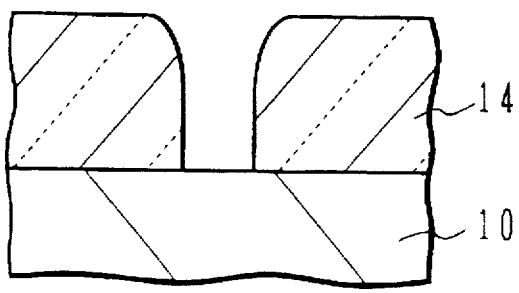
Figure 4C:
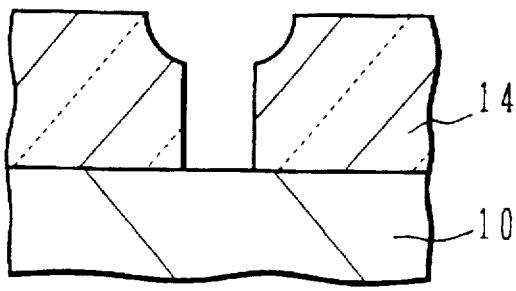

The shape of the contact hole having a sloped portion and a vertical portion can be modified variously, e.g. by the method of forming the hole, as shown in FIGS. 4A, 4B or 4C. Any of these shapes may be employed. All of these shapes comprise a peripheral flat portion $\alpha$, a slope portion $\beta$ formed at a shallow portion of the contact hole, and a vertical wall portion $\gamma$ formed at a deep portion of the contact hole. A diameter of the bottom portion of the contact hole is selected not larger than 1 µm, for example, 0.7 µm. The diameter of the bottom portion of the contact hole may be in a range of 0.2 to 1.0 µm and more preferably in a range of 0.3 to 0.8 µm. The diameter of the hole diverges at a portion higher than 0.5 µm from the bottom to form the slope portion. The height of the vertical wall is selected in a range of 0.1 to 0.7 µm, and preferably in a range of 0.3 to 0.6 µm. The total depth of the hole is at least 0.35 µm and more preferably at least 0.5 µm.

4. First metal (Ti, TiN) layer forming step:

Then, a barrier metal layer comprising a Ti film with a thickness of approximately 20 nm and a TiN film with a thickness of approximately 100 nm covering the contact hole 14a and the insulator layer 14 is formed by sputtering. The Ti film 16 is deposited by sputtering a Ti target in an Ar atmosphere with a pressure of 3 mTorr, and a substrate temperature of 150° C. The TiN film 18 is deposited by sputtering a Ti target in an atmosphere comprising nitrogen to yield a reactive sputtering with a pressure of 4 mTorr, $N_2$ 2.4 mTorr and Ar 1.6 mTorr and a substrate temperature of 150° C . The Ti film 16 and the TiN film 18 are preferably formed in the same vacuum, consecutively. A heating treatment within an $N_2$ atmosphere may be further performed for improving quality of the TiN film. Description has been given for a case of a double layer film. But a barrier metal film may be formed only of a Ti film.

It is known that the deposited TiN film has a columnar or tubular texture or structure vertical to the growth surface. There may be fine spaces between columns.

A $TiO_xN_x$ film may be used in place of the TiN film. A TiON film is known to have a columnar texture as the TiN film, but differs from the TiN film in the point that the space between the columns is filled with oxygen (about 10%) to have an enhanced barrier function against the aluminum migration.

Figure 5:
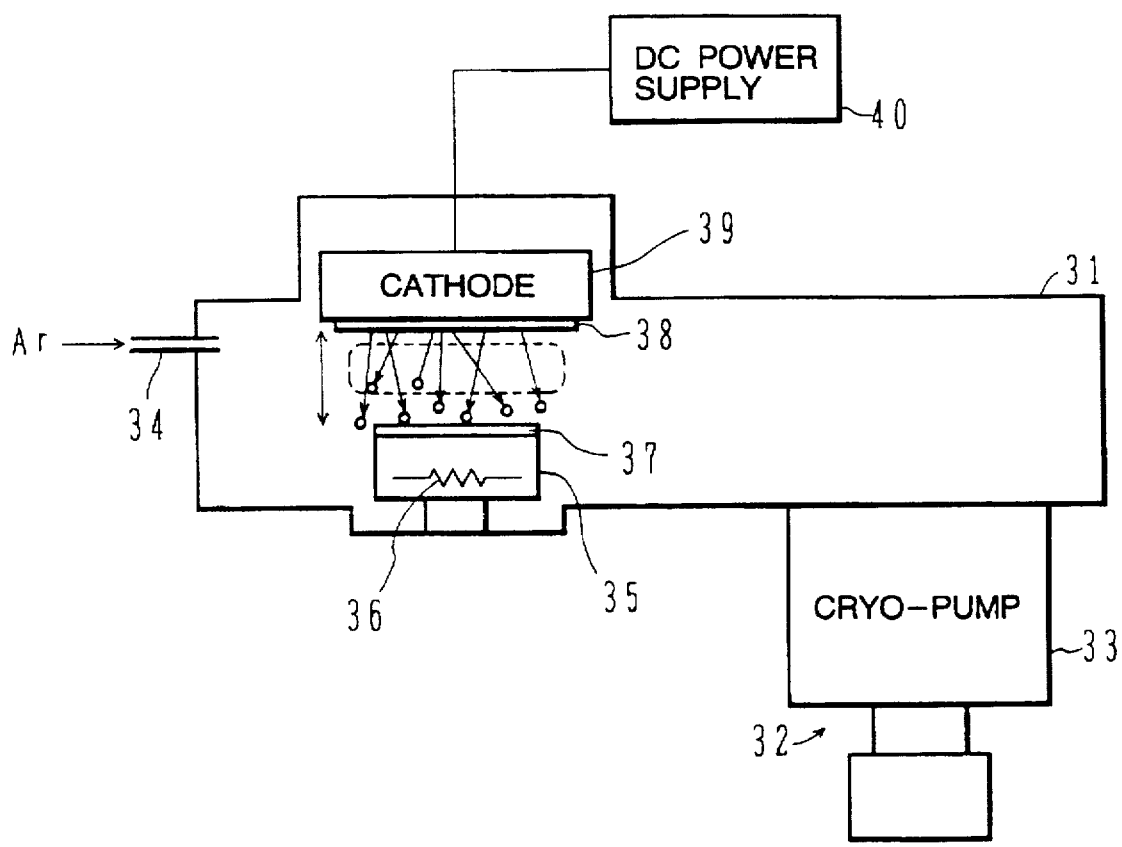
FIG. 5 is a diagram showing a configuration of a sputtering apparatus utilized for forming an Al alloy thin film.

5. Second metal (Al alloy) layer forming step:

Next, an Al alloy layer is deposited by sputtering. Apparatus for sputtering comprises, as shown in FIG. 5, a chamber 31 for forming a film, an evacuator system 32 having a cryo-pump 33 for evacuating the chamber, a gas supply 34 for supplying gas to the chamber, a susceptor 35 accommodating a heater 36 which may be a resistance heater or a gas heater, for supporting a substrate 37, a target 38 disposed above the susceptor 35 at a position facing to the substrate 37, and a cathode 39 connected to DC power supply 40 and supporting the target 38. A distance of the target 38 from the substrate 37 is, for example, approximately 60 mm. The mean free path of Ar gas atoms during sputtering is about several cm. The directions of the sputtered particles are considered to be almost omni-directional.

As a base gas, Ar gas, for example, is employed. After evacuating by the cryo-pump to yield a base pressure of $1 \times 10^{-7}$ Torr, the pressure is adjusted to 8 mTorr by supplying Ar and evacuating the chamber 31. Sputtering is performed employing an Al alloy target of Al—Si(1.0%)—Cu (0.5%), with a substrate temperature set at 100° to 150° C.

An Al alloy layer is formed with a thickness of, for example, approximately 350 nm.

Here, the Ti film 16 and the TiN film 18 may preliminarily be formed employing the same sputtering device and the three layers may be formed consecutively in the same chamber. Alternatively, after forming the Ti film 16 and the TiN film 18 using the same apparatus or different apparatuses, the substrate may be exposed to the atmosphere and then an Al alloy layer 20 may be formed thereon.

6. Wiring patterning step:

A TiN film 22 is further deposited on the Al alloy layer 20 by sputtering. The TiN film 22 functions as an anti-reflection layer for reducing reflection at the Al surface of light in a photolithography step for patterning the wiring layer. Sputtering conditions are similar to those in the formation of the TiN film 18 described above. Thickness of the layer is, for example, 50 nm. Here, the layer 22 may not be limited to TiN, and such material as amorphous Si, or the like, that can reduce reflection may be employed. Also, the anti-reflection layer 22 may be omitted.

A resist film is formed on the whole surface of TiN film 22. A resist mask is formed by exposure and development of the resist film. The anti-reflection layer 22 reduces deformation of the resist mask pattern by reflected light from the Al alloy surface while exposure is performed. The TiN film 22, the Al alloy layer 20, the TiN film 18, and the Ti film 16 are dry-etched using the resist mask as an etching mask. Thus, a wiring layer 24 comprising collective and laminated layers of 16a, 18a, 20a, 22a having the same pattern, as shown in FIG. 3, is formed. The resist is removed after the etch.

In the present process, the whole thickness of the aluminum alloy layer 20 is formed under a temperature range of 100°–150° C. During the formation, the aluminum alloy layer 20 does not experience any temperature higher than the range of 100°–150° C. By forming the aluminum alloy layer in the temperature range of 100°–150° C., the aluminum alloy layer 20 as deposited has a good coverage although it does not experience any high temperature process (such as 300°–550° C.).

As described above, the aluminum alloy layer 20 is covered with the TiN layer 22. Such aluminum alloy layer 20 keeps its topography after the formation of the TiN layer 22 because the TiN layer 22 restricts migration of aluminum or other atoms in the aluminum alloy layer 20. Due to the formation of the TiN layer 22, the topography of the aluminum alloy layer 22 as deposited at 100°–150° C. does not change even if the aluminum alloy layer 22 experiences processes at high temperature (such as 300°–550° C.), later.

Further, breakage of vacuum instead of the formation of the TiN layer 22 causes a similar effect. Namely, the breakage of vacuum converts the exposed surface of the aluminum alloy layer 20 to an oxide layer. The thus formed oxide layer also suppresses changing of the topography of the aluminum alloy layer 20. Under such circumstances, the topography of the aluminum alloy layer 22 as deposited does not change even if the aluminum alloy layer 22 experiences processes in a high temperature range (such as 300°–500° C.).

7. Interlayer insulating layer forming step:

After the patterning step, an interlayer insulating layer 26 is formed over the wiring layer 24 by plasma assisted CVD, or the like as shown in FIG. 3. The insulating layer 26 is formed with BPSG and/or PSG. Also, the insulating layer 26 may be formed from TEOS. Substrate temperature is set to about 400° C. or more during deposition. As described above, the aluminum alloy layer 20 keeps its as-deposited topography formed during the formation of the interlayer insulating layer 22 at a temperature in a range of 100°–150° C.

Figure 6:
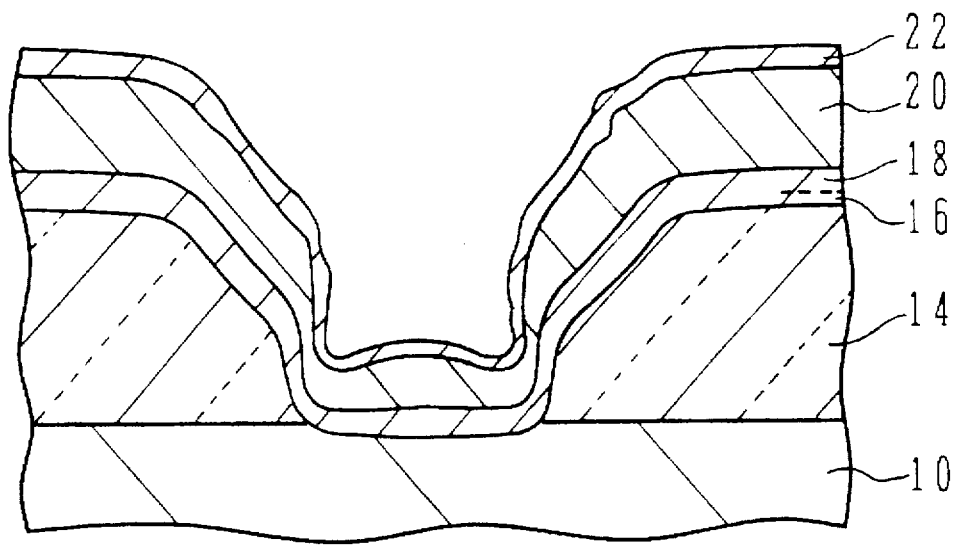
FIG. 6 is a sketch of a scanning electron microscope (SEM) picture showing a cross-section of a contact portion when a substrate temperature for Al alloy sputtering is set to 100° to 150° C.

According to the above-mentioned method of forming wiring, the Al alloy layer 20 has a good coverage even at the contact portion, as shown in FIG. 6. FIG. 6 is a sketch of a scanning electron microscope (SEM) picture showing a section of Al wiring at the contact portion formed through Al alloy sputtering with a substrate temperature set at 100° to 150° C. Similar portions to those in FIGS. 2 and 3 are indicated by similar numerical signs. Protrusions and depressions are not observed on a vertical wall and a sloped portion in an Al alloy layer. In other words, unevenness caused by the protrusions and depressions are eliminated.

Figure 7:
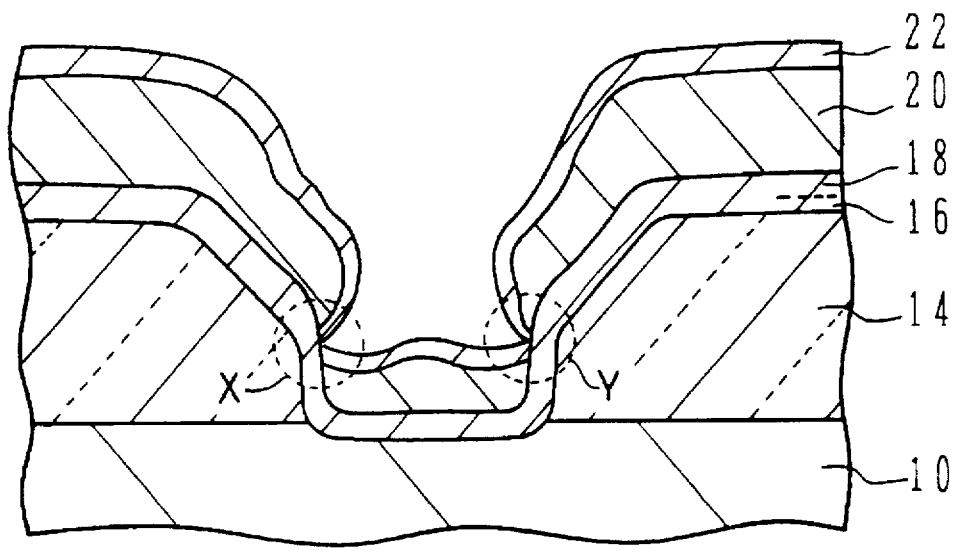
FIG. 7 is a sketch of a scanning electron microscope (SEM) picture showing a cross-section of a contact portion when a substrate temperature for Al alloy sputtering is set to 200° C.
Figure 8:
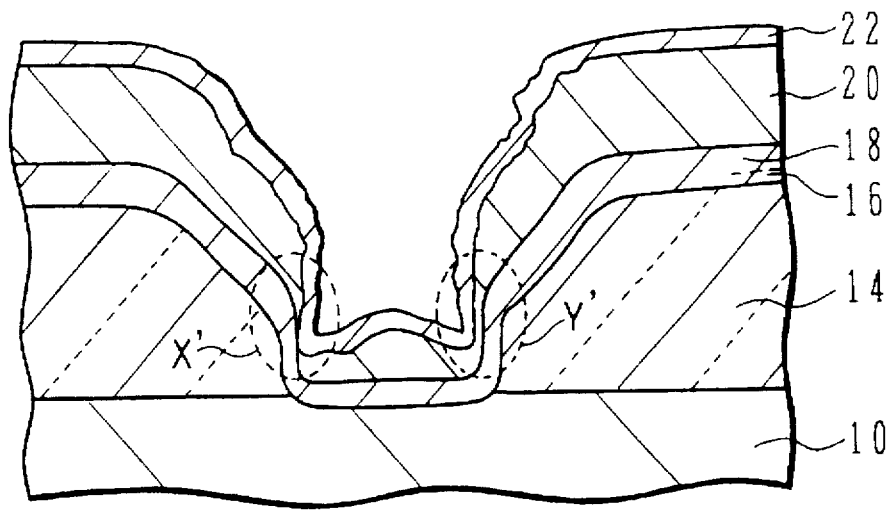
FIG. 8 is a sketch of a scanning electron microscope (SEM) picture showing a cross-section of a contact portion when a substrate temperature for Al alloy sputtering is set to 50° C.

FIGS. 7 and 8 are sketches of SEM pictures showing section of Al wiring at contact portion formed through similar method of wiring formation as described above except for substrate temperature. Similar portions to those in FIG. 6 are indicated by similar numerical signs. FIG. 7 shows a case where the substrate temperature was 200° C. when Al alloy layer was sputtered. It shows a 0% coverage of Al alloy layer at points X and Y. FIG. 8 shows a case where the substrate temperature was 50° C. when Al alloy layer was sputtered. It shows unevenness at points X' and Y' and their vicinity and coverage of Al alloy at points X' and Y' is degraded. Thus, good coverage is obtained with a substrate temperature of 100° to 150° C., unevenness is eliminated so that an Al alloy layer having a smooth vertical wall and a sloped portion is realized. However, with a substrate temperature of 50° C. or 200° C., unevenness still exists in an Al alloy layer so that coverage becomes poor.

The reason for an existence of optimum range of an temperature is considered to be as follows.

Figure 9:
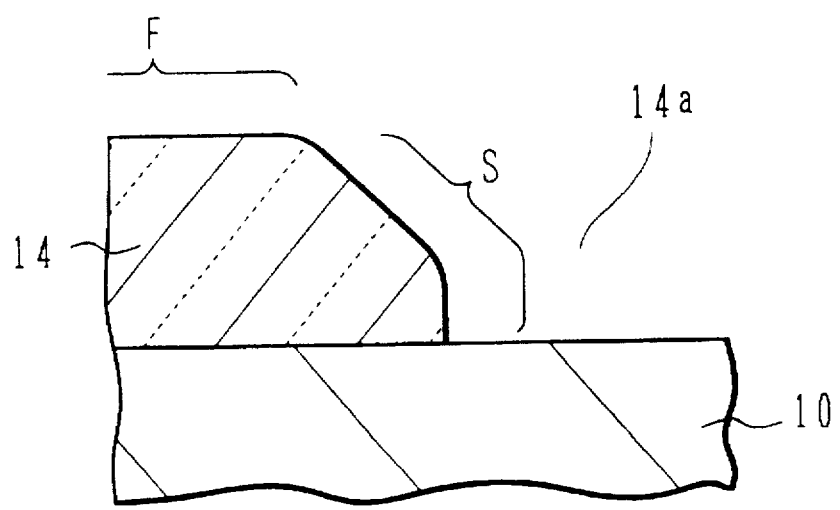
FIG. 9 is a sectional view of the substrate for illustrating growth of a thin film while sputtering Al alloy at a side surface portion of a contact hole.
Figure 10:
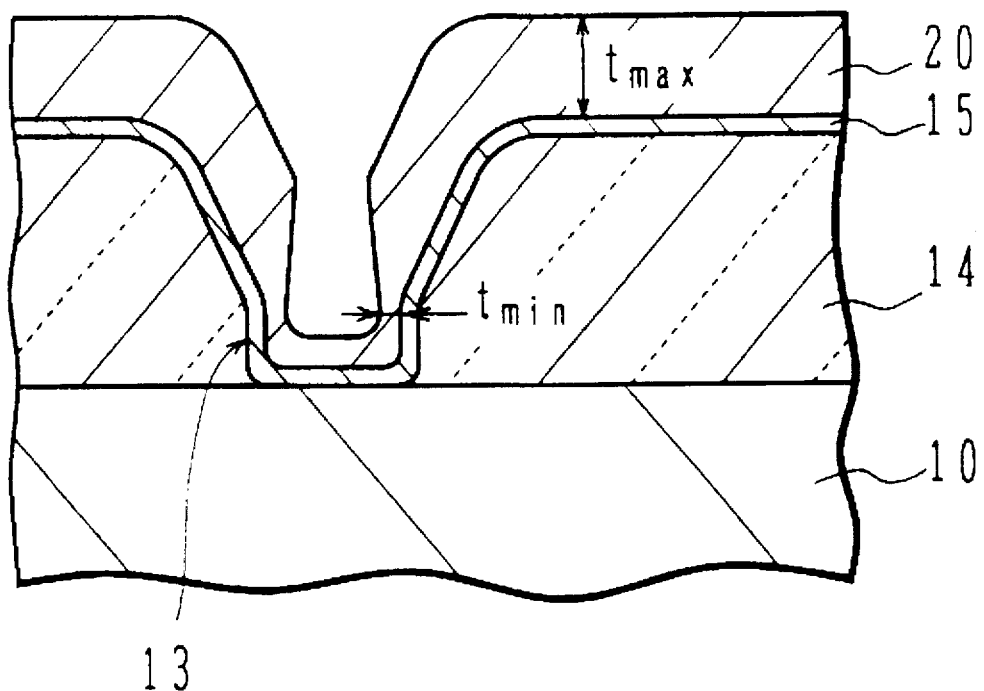
FIG. 10 is a sectional view of a substrate for illustrating the definition of coverage of Al alloy at a contact portion in a wiring structure.

FIG. 9 illustrates growth of thin film on a side wall portion at the contact hole when Al alloy is sputtered. Letter S denotes the side wall of the contact hole 14a including a slope portion, and letter F denotes a flat portion in the vicinity of the contact hole 14a, respectively.

In general, a growth process of an Al alloy thin film is considered to comprise following four steps. Namely, in the first step, nuclei of Al alloy are formed on the surface of an underlying layer. In the second step, the nuclei coalesce to form islands. In the third step, the islands agglomerate to form a thin layer. In the fourth step, grains grow as the thin layer becomes thicker. The first to the third steps depend on the underlying layer and/or the sputtering temperature.

In FIG. 9, the deposition rate is greater on the flat portion F than on the side wall portion S. The islands of the second step are formed faster on the flat portion F than on the side wall portion S. Moreover, as the substrate temperature rises higher than 150° C., larger islands are formed. Grain sizes in a resultant Al layer also become large and thereby to roughen the surface and deteriorate the morphology. Al alloy on the side wall portion S is believed to be pulled up to the flat portion by surface tension of these islands. As a result, as shown in FIG. 7, Al alloy on the side wall portion S is taken away partly. Especially, the surface of the Al layer becomes uneven at the stepped portions.

On the other hand, when the substrate temperature is lower than 100° C., growth of a large island becomes difficult, and a multiplicity of small islands are formed. Positional dependency of deposition rate is large. Deposition rate on the side wall portion S, especially on the vertical wall, is lower than on the flat portion F. Growth of a thin layer is thus slow especially at the vertical wall. The surface of the Al layer becomes constricted at the inside corner, as shown in FIG. 8. Thus, portions with poor coverage of Al alloy are generated.

Here, when a contact hole does not have a slope portion, unlike the above-described one, and has only a vertical side wall, breakage of wiring easily occurs at a lower vertical portion where a vertical wall and a flat bottom portion meet. A good coverage may not be obtained even in a temperature range of 100° to 150° C.

The present invention is not limited to what has been described in the above embodiments, and can be achieved in various modifications and changes. For example, instead of a TiN film 18 or a TiON film, a TiW film having similar properties may be used. As the material of an Al alloy layer, such material as Al—Cu alloy, or the like may be used instead of Al—Si—Cu alloy.

We claim:

1. A method of manufacturing wiring, comprising the steps of:

forming on a substrate having a contact portion, an insulator layer, provided with a contact hole having a surface including a horizontal portion, a slope portion, and a vertical portion in alignment to said contact portion;

forming by sputtering a wiring material layer comprising a Ti film, a TiN, TiON or TiW film, and an Al alloy layer consecutively from a lower level, covering said contact hole and said insulator layer, wherein the entire thickness of said Al alloy layer is formed while said substrate is kept at a temperature in a range from 100° to 150° C.; and patterning the wiring material layer to form a wiring layer according to a wiring pattern.

2. A method of manufacturing wiring according to claim 1, wherein the sputtering of said Ti film and TiN, TiON or TiW film is performed in a same apparatus without breaking vacuum.

3. A method of manufacturing wiring according to claim 1, wherein said TiN, TiON or TiW film is TiN film and the sputtering of said TiN film is achieved with a target of Ti in an atmosphere including $N_2$.

4. A method of manufacturing wiring according to claim 1, wherein the sputtering of said Al alloy layer is performed under such conditions that a distance between an Al alloy target and the substrate, an atmosphere, and an Al alloy pressure are selected to allow deposition of Al alloy on a side wall of said contact hole.

5. A method of manufacturing wiring according to claim 4, wherein the sputtering of said Al alloy layer is achieved to such a thickness that said contact hole is not buried completely.

6. A method of manufacturing wiring according to claim 1, wherein the height of said vertical portion is in a range of 0.1 to 0.7 μm.

7. A method of manufacturing wiring according to claim 6, wherein said height of the vertical portion is in a range of 0.3 to 0.6 μm.

8. A method of manufacturing wiring according to claim 6, wherein said contact hole comprises a diameter equal to or smaller than 1 μm.

9. A method of manufacturing a semiconductor device, comprising the steps of:

(a) providing a semiconductor substrate;

(b) forming an insulating layer over the substrate;

(c) forming a hole through the insulating layer, wherein the hole has a vertical wall and a sloped portion; and (d) forming a lower conductive layer and an aluminum or aluminum alloy upper conductive layer on said insulating layer and said hole to collectively form a patterned conductive wiring, wherein the entire thickness of the upper conductive layer is formed at a substrate temperature in a range from 100° C. to 150° C.

10. A method according to claim 9, wherein the insulating layer comprises a material selected from a group consisting of boron phosphosilicate glass (BPSG), phosphosilicate glass (PSG), spin-on-glass (SOG), and tetraethoxysilane (TEOS) oxide.

11. A method according to claim 9, wherein the height of the vertical wall is in a range of 0.1 to 0.7 μm.

12. A method according to claim 11, wherein the height of the vertical wall is in a range of 0.3 to 0.6 μm.

13. A method according to claim 11, wherein the hole comprises a diameter equal to or smaller than 1 μm.

14. A method according to claim 9, wherein in the step (d), the lower conductive layer comprises a material selected from a group consisting of TiN, TiON, and TiW.

15. A method according to claim 14, wherein the step (d) further comprising the step of:

(d-1) prior to forming the lower conductive layer, forming a Ti layer over the insulating layer.

16. A method according to claim 9, wherein in the step (d), the upper conductive layer comprises a material selected from a group of Al—Cu and Al—Si—Cu alloys.

17. A method according to claim 9, further comprising the step of:

(e) forming a third conductive layer over the upper conductive layer.

18. A method according to claim 7, wherein the third conductive layer comprises TiN.

19. A method according to claim 9, wherein the lower and upper conductive layers are formed through sputtering technique.

20. A method of manufacturing a semiconductor device on a substrate having an insulating layer thereover, comprising the steps of:

(a) forming a contact hole having a wall being substantially vertical and a slope portion above the wall, wherein the wall and the slope portion collectively constitute the contact hole; and (b) forming an aluminum or aluminum alloy conductive layer over the contact hole, wherein the entire thickness of said aluminum or aluminum alloy conductive layer is formed while said substrate is kept at a substrate temperature in a range from 100° to 150° C.

21. A method according to claim 1, further comprising the step of:

forming an interlayer insulating layer over the wiring layer.

22. A method according to claim 21, wherein the interlayer insulating layer comprises a material selected from a group consisting of BPSG, PSG and oxide formed from TEOS.

23. A method according to claim 9, further comprising the step of:

forming an interlayer insulating layer over the patterned conductive wiring.

24. A method according to claim 23, wherein the interlayer insulating layer comprises a material selected from a group consisting of BPSG, PSG and oxide formed from TEOS.

25. A method according to claim 20, further comprising the step of:

forming an interlayer insulating layer over the conductive layer.

26. A method according to claim 25, wherein the interlayer insulating layer comprises a material selected from a group consisting of BPSG, PSG and oxide formed from TEOS.

* * * * *